United States Patent
Barber et al.

(10) Patent No.: US 7,535,323 B2
(45) Date of Patent: May 19, 2009

(54) BULK ACOUSTIC WAVE FILTER WITH REDUCED NONLINEAR SIGNAL DISTORTION

(75) Inventors: Bradley Barber, Acton, MA (US);
Sahana Kenchappa, Woburn, MA (US);
Russ Reisner, Newbury Park, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 211 days.

(21) Appl. No.: 11/484,042

(22) Filed: Jul. 10, 2006

(65) Prior Publication Data

US 2008/0007369 A1     Jan. 10, 2008

(51) Int. Cl.
*H03H 9/54* (2006.01)
(52) U.S. Cl. .................. 333/189; 310/357; 333/192
(58) Field of Classification Search .......... 333/189, 333/187, 188, 133; 310/357
See application file for complete search history.

(56) References Cited

U.S. PATENT DOCUMENTS 5,351,021 A * 9/1994 Masaie et al. ............... 333/189
7,365,619 B2 * 4/2008 Aigner et al. ............... 333/189

FOREIGN PATENT DOCUMENTS

| JP | 02-302114 | * 12/1990 | ............... 333/190 |
| JP | 2003-332884 | * 11/2003 | |
| JP | 2004-173191 | * 6/2004 | |

* cited by examiner

*Primary Examiner*—Barbara Summons
(74) *Attorney, Agent, or Firm*—Lowrie, Lando & Anastasi, LLP

(57) ABSTRACT

A filter circuit includes at least one series resonator having a first terminal and a second terminal, where the first and second terminals of the at least one series resonator are coupled to an input and an output of the filter circuit, respectively. The filter circuit further includes at least one shunt resonator having a first terminal and a second terminal, where the first terminal of the at least one shunt resonator is coupled to the input of the filter circuit and the second terminal of the at least one shunt resonator is coupled to ground. A polarity of the first terminal of the at least one series resonator and a polarity of the first terminal of the at least one shunt resonator are selected so as to reduce harmonic signal generation and other types of distortion in the filter circuit.

15 Claims, 7 Drawing Sheets

BULK ACOUSTIC WAVE FILTER WITH REDUCED NONLINEAR SIGNAL DISTORTION

BACKGROUND OF THE INVENTION

1. Field of the Invention

The present invention is generally in the field of semiconductors and electronic devices. More specifically, the invention is in the field of bulk acoustic wave filters.

2. Background Art

Devices utilizing radio frequencies typically include filters, such as bulk acoustic wave (BAW) filters, in order to filter away unwanted signals, to prevent signal interference, or to eliminate noise. In such applications where BAW filters are used, it is desirable for the input signals allowed to pass through each BAW filter to be provided at the output of the BAW filter without distortion. However, when high power input signals are provided to a BAW filter, the BAW filter may produce a large amount of spurious output signals that may be unacceptable for some strict communication standards, such as the Universal Mobile Telecommunications System.

These spurious output signals typically result from nonlinearities, such as nonlinear elastic coefficients, nonlinear dielectric constants, and nonlinear piezoelectric constants existing in the individual BAW resonators used in the BAW filter. These nonlinearities, therefore, can cause the BAW resonators to generate undesirable harmonic signals which can cause the BAW filters to output spurious signals having twice the driving frequency and result in other types of nonlinear responses such as intermodulation distortion. Moreover, since BAW filters are typically designed using only a linear model, such spurious output signals cannot be predicted and minimized for proper BAW filter operation.

Accordingly, there is a need in the art for a bulk acoustic wave filter that minimizes undesirable harmonic signals to reduce the output of spurious signals. There is also a need for a robust methodology for designing such a filter.

SUMMARY OF THE INVENTION

The present invention is directed to a bulk acoustic wave filter with reduced nonlinear signal distortion. The present invention addresses and resolves the need in the art for a bulk acoustic wave filter that minimizes undesirable nonlinear signal distortion to reduce the output of spurious signals.

According to an exemplary embodiment, a filter circuit includes at least one series resonator having a first terminal and a second terminal, where the first terminal of the at least one series resonator is coupled to an input of the filter circuit and the second terminal of the at least one series resonator is coupled to an output of the filter circuit. The filter circuit further includes at least one shunt resonator having a first terminal and a second terminal, where the first terminal of the at least one shunt resonator is coupled to the input of the filter circuit and the second terminal of the at least one shunt resonator is coupled to ground. The at least one series resonator and the at least one shunt resonator can be bulk acoustic wave (BAW) resonators. The at least one series resonator and the at least one shunt resonator can have a same or different resonant frequency.

According to this exemplary embodiment, the first polarity of the first terminal of the at least one series resonator and the second polarity of the first terminal of the at least one shunt resonator are determined and selected to reduce harmonic signal generation and other types of distortion in the filter circuit. Other features and advantages of the present invention will become more readily apparent to those of ordinary skill in the art after reviewing the following detailed description and accompanying drawings.

DETAILED DESCRIPTION OF THE INVENTION

The present invention is directed to a bulk acoustic wave filter with reduced nonlinear signal distortion. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings. It should be noted that similar numerals generally refer to similar elements in the various drawings.

Figure 1:
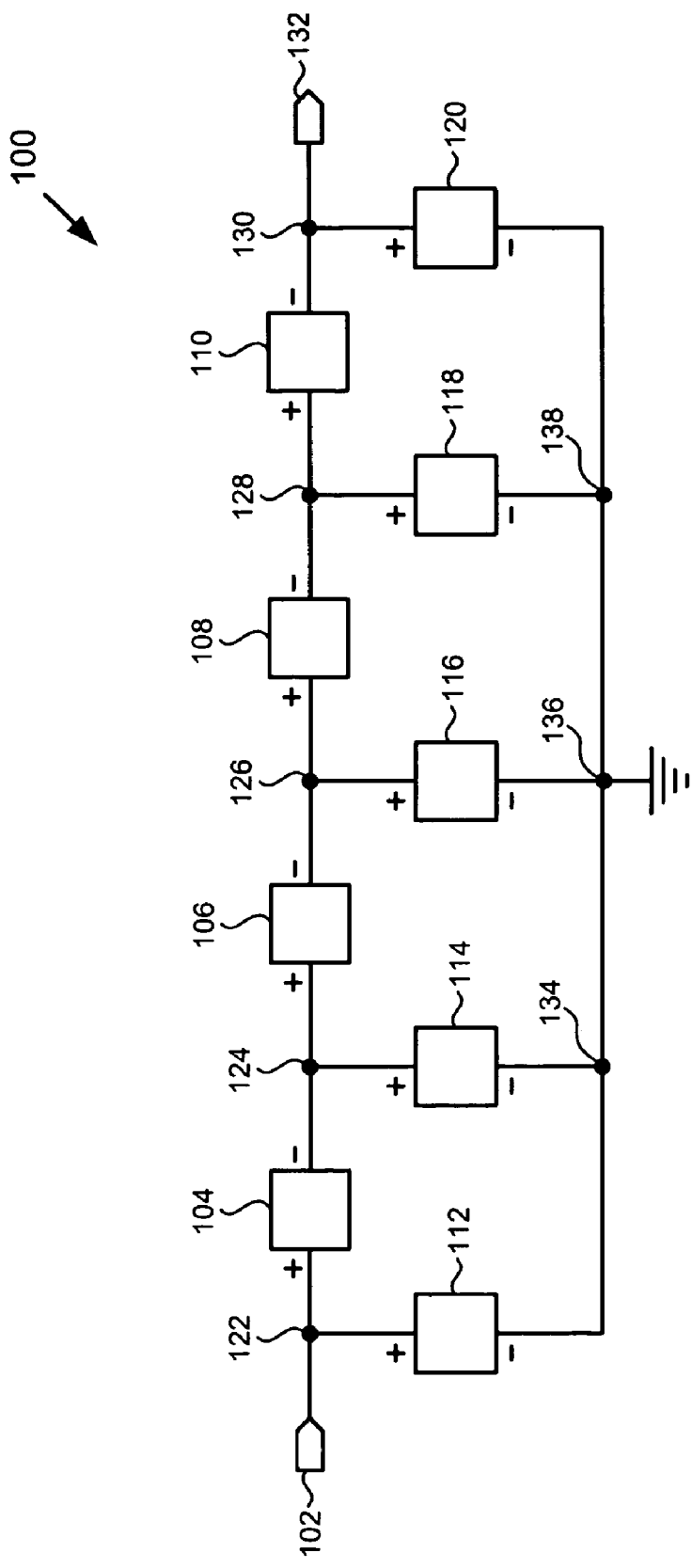
FIG. 1 illustrates a block diagram of a conventional filter circuit.

FIG. 1 shows a block diagram of conventional filter circuit 100, which includes input 102, output 132, series resonators 104, 106, 108, and 110 (hereinafter "series resonators 104 through 110"), and shunt resonators 112, 114, 116, 118, and 120 (hereinafter "shunt resonators 112 through 120"). For example, series resonators 104 through 110 and shunt resonators 112 through 120 in filter circuit 100 can be bulk acoustic wave (BAW) resonators, each BAW resonator potentially having a different resonance frequency.

As shown in FIG. 1, each series resonator and each shunt resonator has a polarity, which is indicated by a positive terminal and a negative terminal of each series and shunt resonator. As also shown in FIG. 1, series resonators 104 through 110 are serially coupled such that the negative terminal of series resonator 104 is coupled to the positive terminal of series resonator 106 at node 124, the negative terminal of series resonator 106 is coupled to the positive terminal of series resonator 108 at node 126, and the negative terminal of series resonator 108 is coupled to the positive terminal of series resonator 110 at node 128. As further shown in FIG. 1, the positive terminal of shunt resonator 112 is coupled to the positive terminal of series resonator 104 and input 102 at node 122.

As shown in FIG. 1, the positive terminals of shunt resonators 114, 116, and 118 are respectively coupled to nodes 124, 126, and 128. As also shown in FIG. 1, the positive terminal of shunt resonator 120 is coupled to the negative terminal of series resonator 110 and output 132 at node 130. As further shown in FIG. 1, the negative terminals of shunt resonators 112 and 114 are coupled to ground at node 134, the negative terminals of shunt resonators 118 and 120 are coupled to ground at node 138, and the negative terminal of shunt resonator 116 is coupled to ground at node 136.

In conventional filter circuit 100 shown in FIG. 1, the respective polarities of series resonators 104 through 110 are all similarly oriented, such that the negative terminal of one series resonator (e.g., series resonator 104) is coupled to the positive terminal of a subsequent series resonator (e.g., series resonator 106). As also shown in FIG. 1, the respective polarities of shunt resonators 112 through 120 are similarly oriented, such that the negative terminals of shunt resonators 112 through 120 are all coupled to ground.

By way of background, the series and shunt resonators in filter circuit 100 may contain nonlinearities, such as nonlinear elastic coefficients, nonlinear dielectric constants, and nonlinear piezoelectric constants. These nonlinearities can cause the series and shunt resonators to generate undesirable harmonic signals or in other ways distort the desired input signals that are to be filtered by filter circuit 100, thus resulting in improper functionality of the filter circuit. Thus, the configuration of series and shunt resistors in conventional filter circuit 100 suffers from significant drawbacks.

Figure 2:
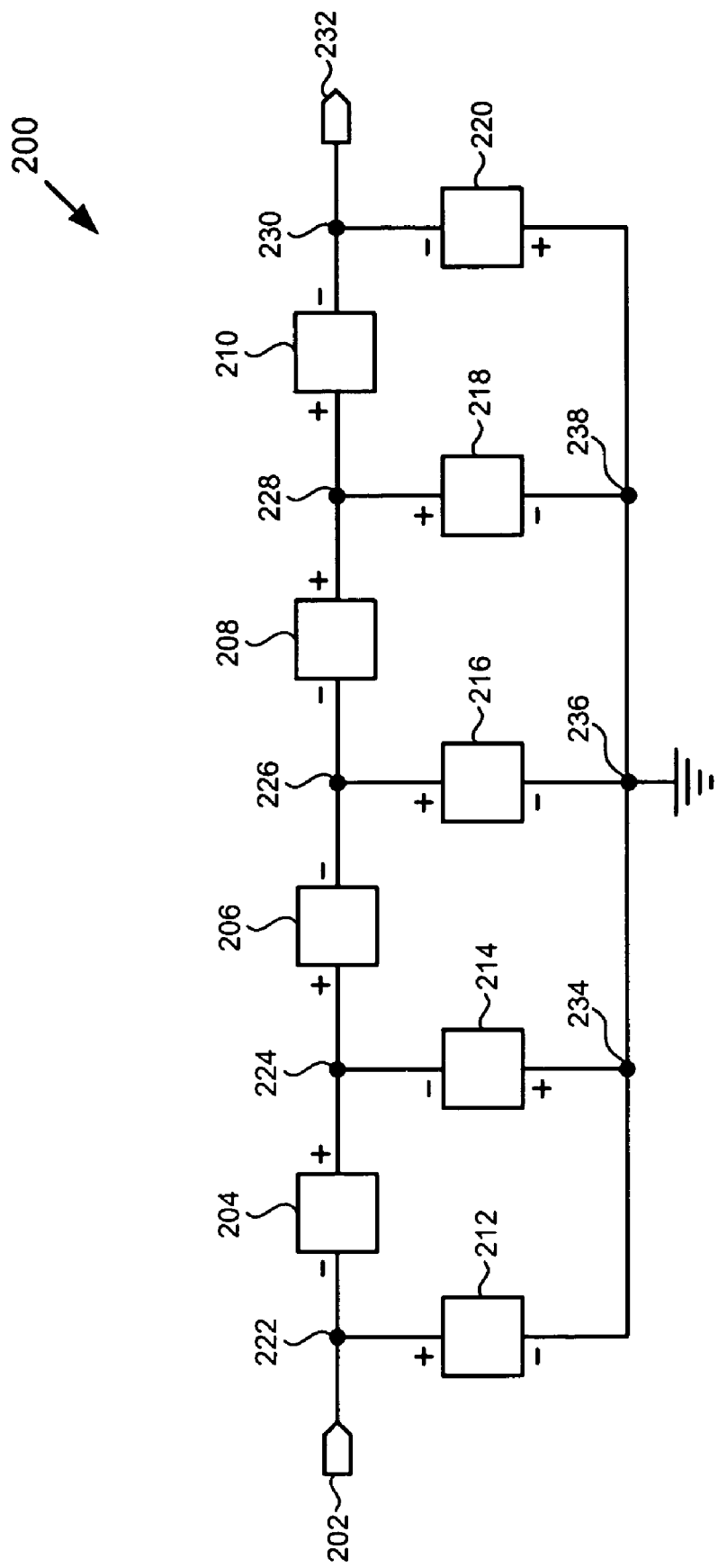
FIG. 2 illustrates a block diagram of a filter circuit in accordance with one embodiment of the present invention.

FIG. 2 shows a block diagram of filter circuit 200 in accordance with one embodiment of the present invention. Certain details and features have been left out of FIG. 2, which are apparent to a person of ordinary skill in the art. As shown in FIG. 2, filter circuit 200 includes input 202, output 232, series resonators 204, 206, 208, and 210 (hereinafter "series resonators 204 through 210"), and shunt resonators 212, 214, 216, 218, and 220 (hereinafter "shunt resonators 212 through 220"). For example, series resonators 204 through 210 and shunt resonators 212 through 220 in filter circuit 200 can be bulk acoustic wave (BAW) resonators, where each BAW resonator has a different resonance frequency.

As shown in FIG. 2, each series resonator and each shunt resonator has a polarity, which is indicated by a positive terminal and a negative terminal of each resonator. As also shown in FIG. 2, series resonators 204 through 210 are serially coupled such that the positive terminal of series resonator 204 is coupled to the positive terminal of series resonator 206 at node 224, the negative terminal of series resonator 206 is coupled to the negative terminal of series resonator 208 at node 226, and the positive terminal of series resonator 208 is coupled to the positive terminal of series resonator 210 at node 228.

As further shown in FIG. 2, the positive terminal of shunt resonator 212 is coupled to the negative terminal of series resonator 204 and to input 202 at node 222. As shown in FIG. 2, the positive terminals of shunt resonators 216 and 218 are respectively coupled to nodes 226 and 228. As also shown in FIG. 2, the negative terminal of shunt resonator 214 is coupled to node 224. As further shown in FIG. 2, the negative terminal of shunt resonator 220 is coupled to the negative terminal of series resonator 210 and to output 232 at node 230. As further shown in FIG. 2, the negative terminal of shunt resonator 212 and the positive terminal of shunt resonator 214 are coupled to ground at node 234, the negative terminal of shunt resonator 216 is coupled to ground at node 236, and the negative terminal of shunt resonator 218 and the positive terminal of shunt resonator 220 are coupled to ground at node 238.

As previously discussed, each series and shunt resonator in filter circuit 200 shown in FIG. 2 can generate undesirable harmonic signals or other distortions due to nonlinearities existing in each series and shunt resonator. The phase of an undesirable harmonic signal generated by a series or shunt resonator is shifted by reversing the polarity of the series or shunt resonator. As such, the invention reduces the harmonics generated by the series and shunt resonators by reversing the polarities of selected series and shunt resonators such that the harmonics generated by the series and shunt resonators are partially cancelled by the phase-shifted harmonics generated by the selected series and shunt resonators having reversed polarity.

For example, in the embodiment of the invention shown in FIG. 2, the polarities of series resonators 204 and 208 are reversed with respect to the polarities of series resonators 206 and 210 and the polarities of shunt resonators 214 and 220 are reversed with respect to the polarities of shunt resonators 212, 216, and 218. As such, any harmonic signals generated by series resonators 204 and 208 and shunt resonators 214 and 220 will be advantageously phase shifted with respect to the harmonics generated by series resonators 206 and 210 and shunt resonators 212, 216, and 218, thereby allowing at least partial cancellation of the harmonics generated by series resonators 206 and 210 and shunt resonators 212, 216, and 218.

It is noted that, in general, filter circuit 200 will be coupled to external components, such as capacitors and/or inductors and/or interconnects, within the broader RF system; the interconnects, such as wirebonds or device interconnects, also have their own capacitance and inductance. These capacitive and inductive components and loads are in effect coupled in parallel or series with at least some of the resonators 204 through 210 and 212 through 220 in FIG. 2. Any nonlinear signal distortion generated at each resonator 204 through 220 can be affected by these additional inductive and capacitive components and loads which change the phase, voltage and current relationship at the resonators. In some cases changing the values or configuration of the external components and loads themselves might reduce the overall signal distortion. However, in general, the effect of these external components and loads should be considered in appropriately determining and selecting the polarities of the resonators in order to minimize the overall nonlinear signal distortion.

Figure 3:
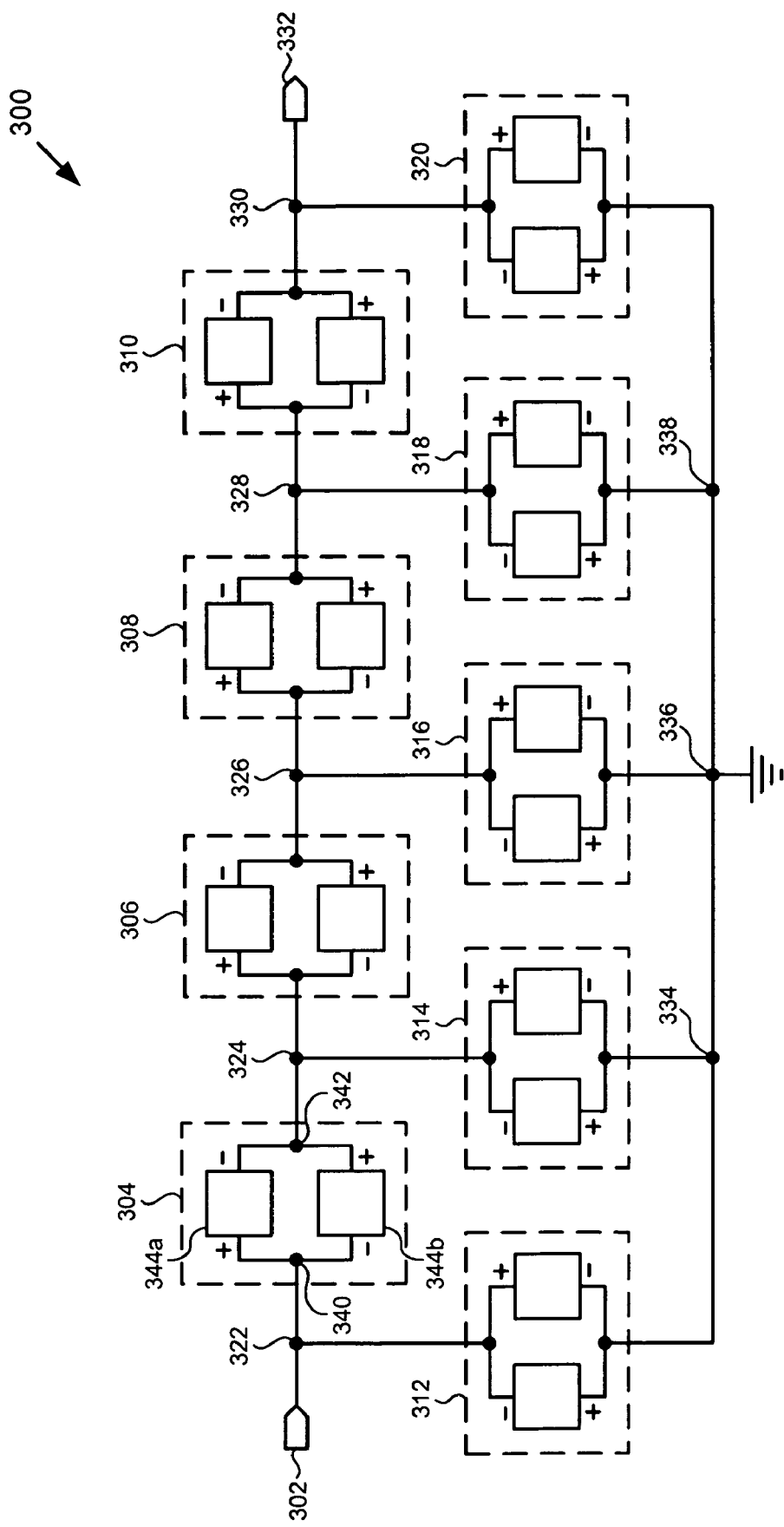
FIG. 3 illustrates a block diagram of a filter circuit in accordance with one embodiment of the present invention.

FIG. 3 shows a block diagram of filter circuit 300 in accordance with one embodiment of the present invention. Certain details and features have been left out of FIG. 3, which are apparent to a person of ordinary skill in the art. As shown in FIG. 3, filter circuit 300 includes input 302, output 332, series resonator pairs 304, 306, 308, and 310 (hereinafter "series resonator pairs 304 through 310"), and shunt resonator pairs 312, 314, 316, 318, and 320 (hereinafter "shunt resonator pairs 312 through 320").

As shown in FIG. 3, each shunt resonator pair and series resonator pair in filter circuit 300 can include, for example, first and second BAW resonators having the same resonance frequency. Each first and second BAW resonator has a polarity indicated by a positive terminal and a negative terminal. The first and second BAW resonators included in each shunt resonator pair and series resonator pair are coupled together in an anti-parallel configuration, such that the positive terminal of the first BAW resonator is coupled to the negative terminal of the second BAW resonator and the negative terminal of the first BAW resonator is coupled to the positive terminal of the second BAW resonator. For example, as shown in FIG. 3, series resonator pair 304 includes first resonator 344a and second resonator 344b coupled together in an anti-parallel configuration, such that the positive terminal of first resonator 344a is coupled to the negative terminal of second resonator 344b at node 340, and the negative terminal of first resonator 344a is coupled to the positive terminal of second resonator 344b at node 342.

As shown in FIG. 3, input 302 is coupled to the first terminal of series resonator pair 304 at node 322. As also shown in FIG. 3, the second terminal of series resonator pair 304 is coupled to the first terminal of series resonator pair 306 at node 324, the second terminal of series resonator pair 306 is coupled to the first terminal of resonator pair 308 at node 326, and the second terminal of series resonator pair 308 is coupled to the first terminal of series resonator pair 310 at node 328. As further shown in FIG. 3, the second terminal of series resonator pair 310 is coupled to output 332 at node 330. As shown in FIG. 3, the first terminal of shunt resonator pair 312 is coupled to the first terminal of series resonator pair 304 and to input 302 at node 322. As also shown in FIG. 3, the first terminals of shunt resonator pairs 314, 316, and 318 are respectively coupled to nodes 324, 326, and node 328. The first terminal of shunt resonator pair 320 is coupled to input 332 at node 330. As further shown in FIG. 3, the second terminals of shunt resonator pairs 312 and 314 are coupled to ground at node 334, the second terminal of shunt resonator pair 316 is coupled to ground at node 336, and the second terminals of shunt resonator pairs 318 and 320 are coupled to ground at node 338.

As previously discussed, each resonator can generate undesirable harmonic signals or other distortion due to non-linearities existing in each resonator. Since the phase of an undesirable harmonic signal generated by a resonator can be shifted by reversing the polarity of the resonator, the anti-parallel configuration of the first and second resonators advantageously allows the second harmonics generated by the first resonator to be substantially canceled by the phase-shifted harmonics generated by the second resonator. As such, each series and shunt resonator pair in filter circuit 300 provides filtering of a desired frequency while substantially reducing the amplitudes of any undesirable second harmonic signals. This reduction of undesirable harmonic signals by the internal anti-parallel configuration in each series and shunt resonator pair enables filter circuit 300 to provide improved performance over conventional filter circuit 100.

Other non-linear distortion products can be similarly eliminated or reduced through advantageous configurations of individual resonators resulting in advantageous phase shifts and phase differences between the individual resonators. In general, to reduce magnitudes of all undesired nonlinear responses, a nonlinear model of the resonators' response will be utilized and a numerical optimization scheme would be performed. The optimization goal would be to reduce all undesired nonlinear responses while performing the desired linear filtering. As nonlinear signal production depends on filter construction, co-optimization of filter linear response and filter non-linear response should be performed. The results of this co-optimization will dictate the physical areas and resonance frequencies desired for each resonator in the circuit. Moreover, resonator polarities can be used for improved nonlinear product reduction. An example is that of using two resonators with equal areas and same frequency coupled in an anti-parallel configuration which will substantially cancel out the resonators' second harmonic. It is often this second harmonic that is most prevalent in BAW filter devices, so its elimination and reduction is quite advantageous in various applications.

Figure 4:
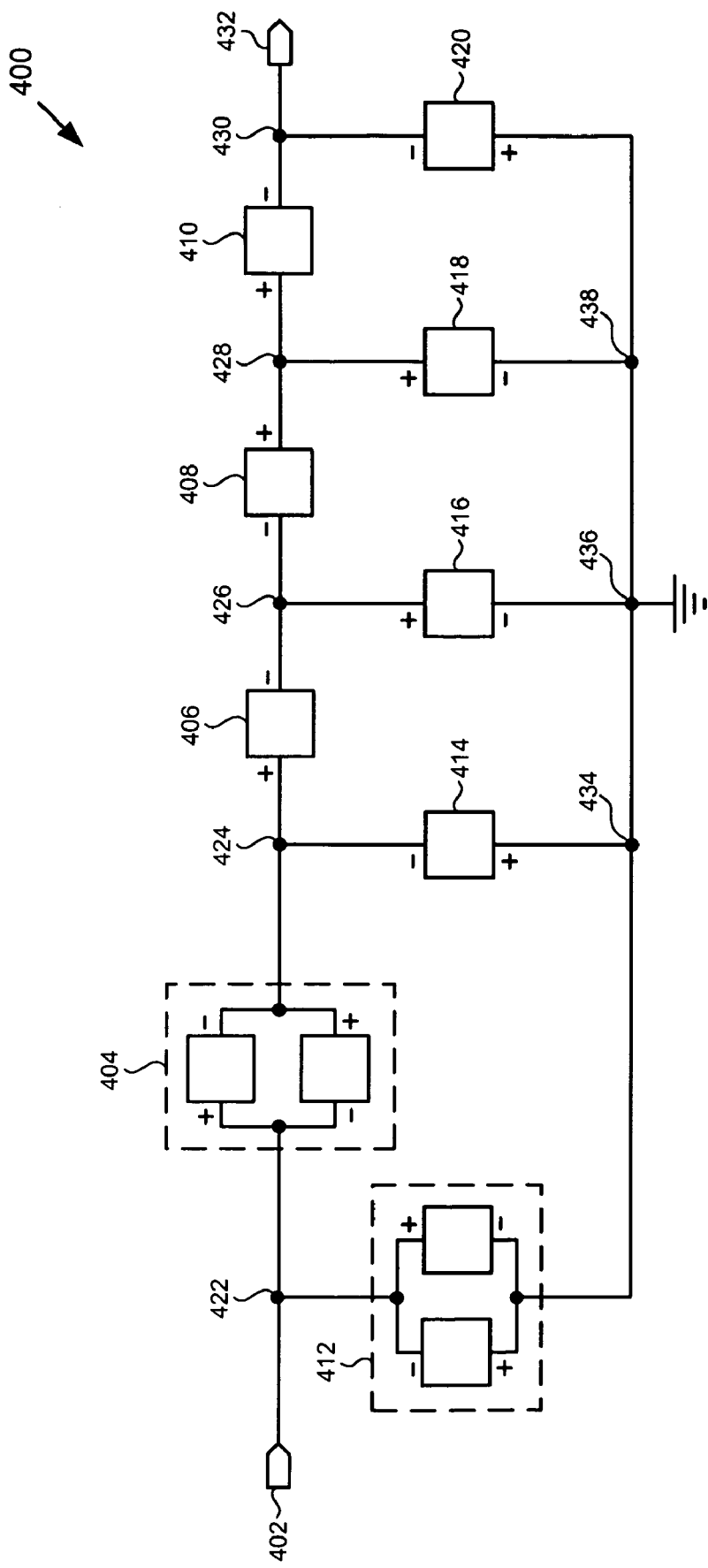
FIG. 4 illustrates a block diagram of a filter circuit in accordance with one embodiment of the present invention.

FIG. 4 shows a block diagram of filter circuit 400 in accordance with one embodiment of the present invention. Certain details and features have been left out of FIG. 4, which are apparent to a person of ordinary skill in the art. As shown in FIG. 4, filter circuit 400 includes input 402, output 432, series resonator pair 404, shunt resonator pair 412, series resonators 406, 408, and 410 (hereinafter "series resonators 406 through 410"), and shunt resonators 414, 416, 418, and 420 (hereinafter "shunt resonators 414 through 420").

As shown in FIG. 4, series resonators 406 through 410 and shunt resonators 414 through 420 each have a polarity, which is indicated by a positive terminal and a negative terminal of each series and shunt resonator. As also shown in FIG. 4, series resonator pair 404 and shunt resonator pair 412 can include, for example, first and second BAW resonators having the same resonance frequency. Each first and second BAW resonator has a polarity indicated by a positive terminal and a negative terminal. As shown in FIG. 4, the first and second BAW resonators included in series resonator pair 404 and shunt resonator pair 412 are coupled together in an anti-parallel configuration, such that the positive terminal of the first BAW resonator is coupled to the negative terminal of the second BAW resonator and the negative terminal of the first BAW resonator is coupled to the positive terminal of the second BAW resonator.

As shown in FIG. 4, the first terminal of series resonator pair 404 is coupled to input 402 at node 422. As also shown in FIG. 4, series resonators 406 through 410 are serially coupled such that the positive terminal of series resonator 406 is coupled to the second terminal of series resonator pair 404 at node 424, the negative terminal of series resonator 408 is coupled to the negative terminal of series resonator 406 at node 426, the positive terminal of series resonator 410 is coupled to the positive terminal of series resonator 408 at node 428, and the negative terminal of series resonator 410 is coupled to output 432 at node 430.

As further shown in FIG. 4, the first terminal of shunt resonator pair 412 is coupled to the first terminal of series resonator pair 404 and to input 402 at node 422. As shown in FIG. 4, the negative terminals of shunt resonators 414 and 420 are coupled to nodes 424 and 430, respectively. As also shown in FIG. 4, the positive terminals of shunt resonators 416 and 418 are coupled to nodes 426 and 428, respectively. As further shown in FIG. 4, the second terminal of shunt resonator pair 412 and the positive terminal of shunt resonator 414 are coupled to ground at node 434, the negative terminal of shunt resonator 416 is coupled to ground at node 436, and the negative terminal of shunt resonator 418 and the positive terminal of shunt resonator 420 are coupled to ground at node 438.

Thus, as shown in FIG. 4, filter circuit 400 includes a configuration of series and shunt resonator pairs as well as individual resonators coupled in series or in shunt. As previously discussed, the anti-parallel configuration of the series and shunt resonator pairs, e.g., series resonator pair 404 and shunt resonator pair 412, provides a substantial reduction of undesirable harmonics generated by each resonator included in the series and shunt resonator pairs. Moreover, filter circuit 400 reduces the harmonics generated by the individual series and shunt resonators, e.g., series resonators 406 through 410 and shunt resonators 414 through 420, by reversing the polarities of selected series and shunt resonators, e.g., through series resonator 408 and shunt resonators 414 and 420, such that any harmonics generated by the series and shunt resonators are at least partially cancelled by the phase-shifted harmonics generated by the selected series and shunt resonators having reversed polarity.

Resonators at the input or high power side of a filter circuit typically generate more harmonic signals or other nonlinear distortions as compared to resonators at the output side of the filter circuit. As such, in filter circuit 400 shown in FIG. 4, the first terminal of series resonator pair 404 and the first terminal of shunt resonator pair 412 are coupled to input 402 to provide substantial reduction of harmonic signals generated at the input side of filter circuit 400. Therefore, by utilizing series and shunt resonator pairs at the input side of a filter circuit and by reversing the polarities of selected series and shunt resonators to provide at least partial cancellation of harmonic signals, filter circuit 400 provides improved performance over conventional filter circuit 100.

Figure 5:
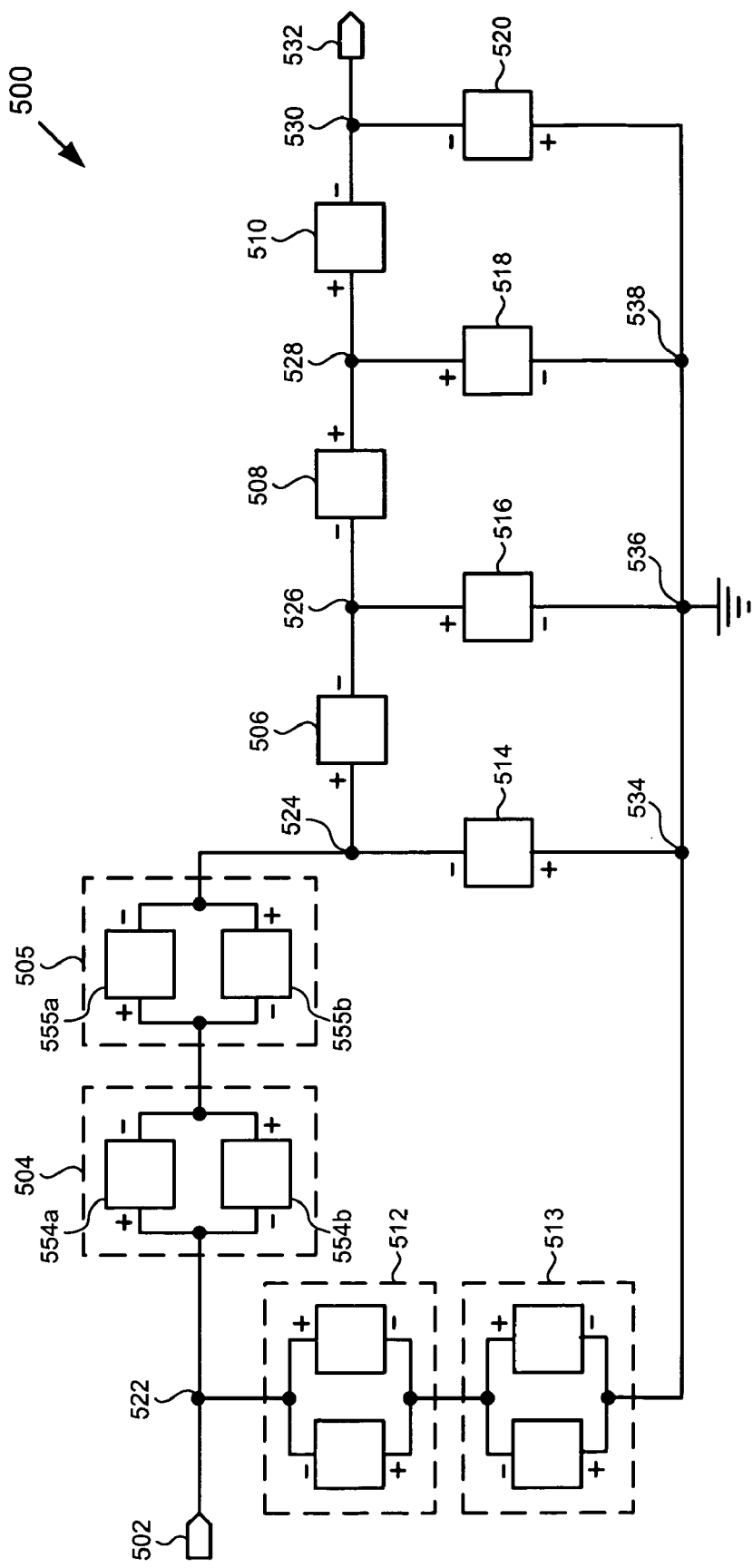
FIG. 5 illustrates a block diagram of a filter circuit in accordance with one embodiment of the present invention.

FIG. 5 shows a block diagram of filter circuit 500 in accordance with one embodiment of the present invention. Certain details and features have been left out of FIG. 5, which are apparent to a person of ordinary skill in the art. As shown in FIG. 5, filter circuit 500 includes input 502, output 532, series resonator pair 504, shunt resonator pair 512, series resonators 506, 508, and 510 (hereinafter "series resonators 506 through 510"), and shunt resonators 514, 516, 518, and 520 (hereinafter "shunt resonators 514 through 520"), which respectively correspond to input 402, output 432, series resonator pair 404, shunt resonator pair 412, series resonators 406, 408, and 410, and shunt resonators 414, 416, 418, and 420 of filter circuit 400 in FIG. 4. As also shown in FIG. 5, filter circuit 500 further includes series resonator pair 505 and shunt resonator pair 513.

As shown in FIG. 5, filter circuit 500 includes two series resonator pairs, i.e., series resonator pairs 504 and 505, coupled together in a series configuration and two shunt resonator pairs, i.e., shunt resonator pairs 512 and 513, coupled together in a series configuration. As also shown in FIG. 5, the first terminal of series resonator pair 504 is coupled to input 502 at node 522 and the second terminal of series resonator pair 504 is coupled to the first terminal of series resonator pair 505. As further shown in FIG. 5, the second terminal of series resonator 505 is coupled to node 524. As shown in FIG. 5, the first terminal of shunt resonator pair 512 is coupled to input 502 at node 522 and the second terminal of shunt resonator pair 512 is coupled to the first terminal of shunt resonator pair 513. As also shown in FIG. 5, the second terminal of shunt resonator 513 is coupled to ground at node 534.

In filter circuit 500, for example, series resonator pairs 504 and 505 can each include two BAW resonators having the same or different resonance frequency coupled together in an anti-parallel configuration, such that the resonance frequency of series resonator pair 504 is equal to the resonance frequency of series resonator pair 505. For example, as shown in FIG. 5, series resonator pair 504 can include first resonator 554a and second resonator 554b and series resonator pair 505 can include first resonator 555a and second resonator 555b, where first resonators 554a and 555a and second resonators 554b and 555b each have the same resonance frequency.

As discussed below, for the particular case when the reduction of the second harmonic is desired, in one embodiment each series and shunt resonator pair shown in FIG. 5 could be formed by dividing a single series or shunt resonator, e.g., series resonator 506 or shunt resonator 514, so as to form first and second resonators that are each approximately one-half the physical size of the undivided series or shunt resonator. In the case of BAW resonators, however, this particular embodiment might result in acoustic loss due to the size reduction of each resonator. In the preferred embodiment of the invention shown in FIG. 5, two series resonator pairs are coupled in a series configuration, e.g., series resonator pairs 504 and 505, where the size of each resonator in the configuration is the same as the original undivided resonator. The performance of this preferred embodiment is generally better than when a single resonator is divided into two resonators, and this preferred embodiment may also provide additional cancellation of higher order nonlinearities. Similarly when including two shunt resonator pairs coupled in a series configuration, e.g., shunt resonator pairs 512 and 513, in the preferred embodiment the larger resonators are used to result in improved performance.

Thus, each series or shunt resonator pair can include first and second resonators (e.g., first resonator 554a and second resonator 554b) coupled together in an anti-parallel configuration, where each first and second resonator is approximately equal in physical size to an undivided series or shunt resonator (e.g., series resonator 506 or shunt resonator 514). The anti-parallel configuration of the first and second resonators in each series or shunt resonator pair, however, provides one-half of the impedance of an undivided series or shunt resonator. As such, if an anti-parallel configuration with the impedance of an undivided series or shunt resonator is desired, two series resonator pairs can be coupled in a series configuration (e.g., series resonator pairs 504 and 505) or two shunt resonator pairs can be coupled in a series configuration (e.g., shunt resonator pairs 512 and 513), where each series or shunt resonator pair includes first and second resonators that are approximately equal in size to an undivided series or shunt resonator.

Figure 6:
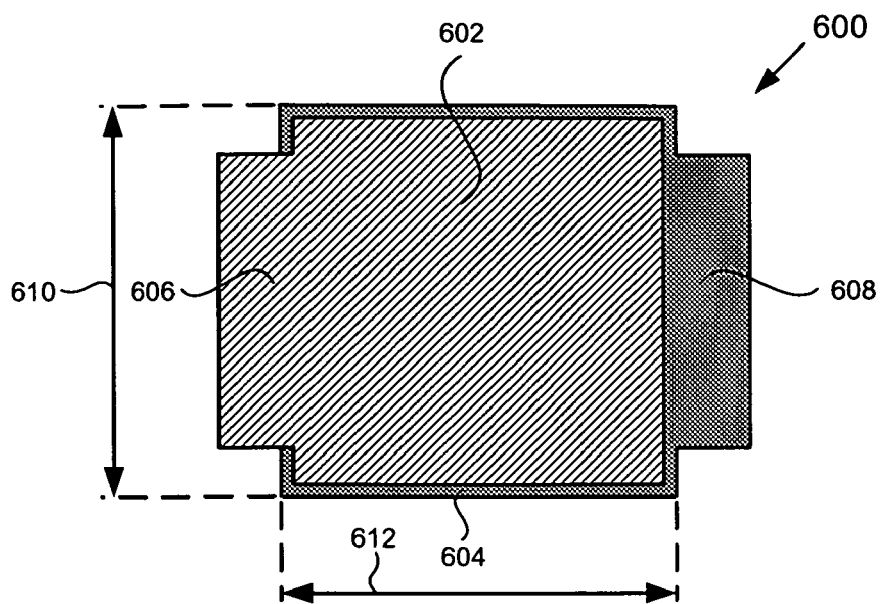
FIG. 6 illustrates a layout diagram of a resonator structure in accordance with one embodiment of the present invention.

FIG. 6 shows a layout diagram of a resonator structure in accordance with one embodiment of the present invention. FIG. 6 includes resonator 600, which is one way to implement the individual series and shunt resonators shown in FIGS. 1 through 5. Resonator 600 can be, for example, a bulk acoustic wave (BAW) resonator. As shown in FIG. 6, resonator 600 includes top electrode 602, which can comprise metal patterned and formed in an upper metal layer of a semiconductor structure, and bottom electrode 604, which can comprise metal patterned and formed in a lower metal layer of a semiconductor structure. Thus, as further shown in FIG. 6, top electrode 602 is situated over bottom electrode 604. A piezoelectric material (not shown in FIG. 6), such as Aluminum Nitride (AlN), can be situated between top electrode 602 and bottom electrode 604.

As shown in FIG. 6, resonator 600 has width 610 and length 612. For example, width 610 and length 612 can each be approximately 140 microns, such that the total area of resonator 600 is approximately 20,000 square microns. As further shown in FIG. 6, resonator 600 includes first terminal 606 and second terminal 608, which are respectively connected to top electrode 602 and bottom electrode 604. Resonator 600 has a polarity such that first terminal 606 represents the positive terminal of resonator 600 and second terminal 608 represents the negative terminal of resonator 600.

Figure 7:
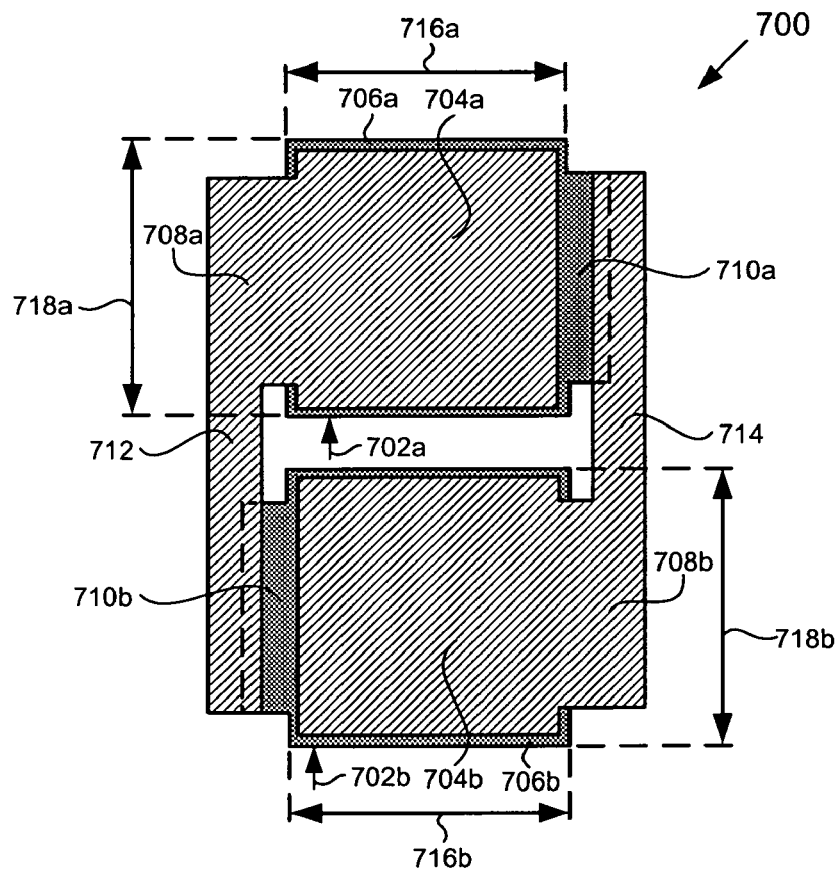
FIG. 7 illustrates a layout diagram of a resonator pair structure in accordance with one embodiment of the present invention.

FIG. 7 shows a layout diagram of a resonator pair structure in accordance with one embodiment of the present invention. FIG. 7 includes resonator pair structure 700 which is one way to implement the series and shunt resonator pairs shown in FIGS. 1 through 5. As shown in FIG. 7, resonator pair structure 700 includes first resonator 702a and second resonator 702b which can be, for example, bulk acoustic wave (BAW) resonators. As shown in FIG. 7, first resonator 702a and second resonator 702b each include respective top electrodes 704a and 704b, which can comprise metal patterned and formed in an upper metal layer of a semiconductor structure, and respective bottom electrodes 706a and 706b, which can comprise metal patterned and formed in a lower metal layer of a semiconductor structure. Thus, as further shown in FIG. 7, top electrodes 704a and 704b are respectively situated over bottom electrodes 706a and 706b. A piezoelectric material (not shown in FIG. 7), such as Aluminum Nitride (AlN), can be situated between top electrode 704a and bottom electrode 706a of first resonator 702a and between top electrode 704b and bottom electrode 706b of second resonator 702b.

As shown in FIG. 7, first resonator 702a and second resonator 702b have respective widths 718a and 718b and respective lengths 716a and 716b. For example, widths 718a and 718b and lengths 716a and 716b can each be approximately 100 microns, such that the total area of each resonator 702a and 702b is approximately 10,000 square microns. As also shown in FIG. 7, resonators 702a and 702b each include respective first terminals 708a and 708b and respective second terminals 710a and 710b. As further shown in FIG. 7, first terminals 708a and 708b are respectively connected to top electrodes 704a and 704b and second terminals 710a and 710b are respectively connected to bottom electrodes 706a and 706b. First resonator 702a and second resonator 702b each have a polarity, where first terminals 708a and 708b represent the respective positive terminals of first resonator 702a and second resonator 702b and where second terminals 710a and 710b represent the respective negative terminals of first resonator 702a and second resonator 702b.

As shown in FIG. 7, first resonator 702a and second resonator 702b are coupled together in an anti-parallel configuration. More specifically, first terminal 708a (i.e., the positive terminal) of first resonator 702a is connected by top metal portion 712 to second terminal 710b (i.e., the negative terminal) of second resonator 702b through a via (not shown in FIG. 7) and second terminal 710a (i.e., the negative terminal) of first resonator 702a is connected to top metal portion 714 through a via (not shown in FIG. 7), so as to be connected to first terminal 708b (i.e., the positive terminal) of second resonator 702b. Therefore, as shown in FIG. 7, resonator pair 700 can be formed by dividing a single resonator (e.g., resonator 600 in FIG. 6) to form two resonators (e.g., first resonator 702a and second resonator 702b), such that each first and second resonator has one-half the physical size of the undivided resonator.

Figure 8:
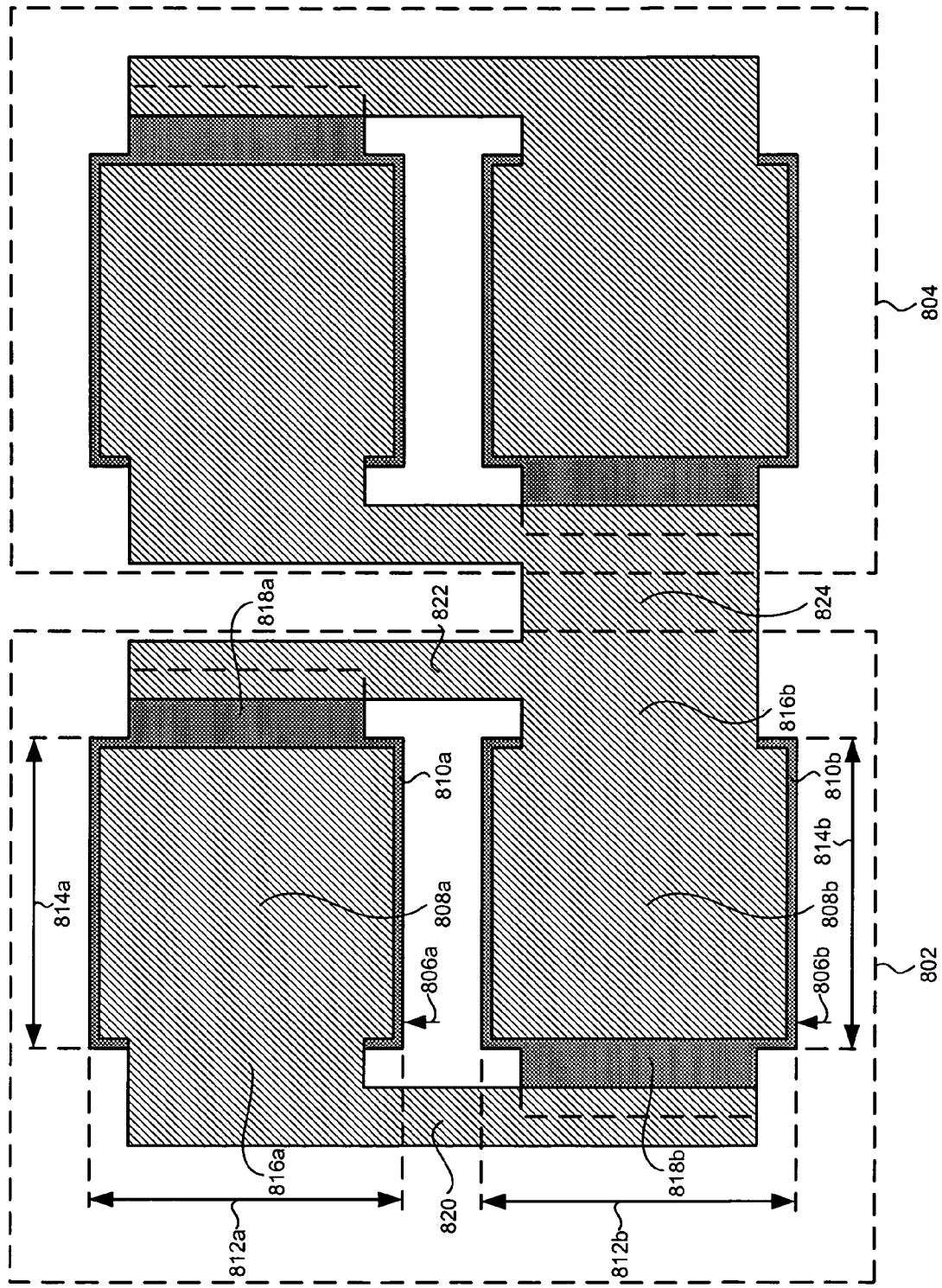
FIG. 8 illustrates a layout diagram of two resonator pair structures coupled together in a series configuration in accordance with one embodiment of the present invention.

FIG. 8 shows a layout diagram of two resonator pair structures coupled together in a series configuration in accordance with one embodiment of the present invention. FIG. 8 includes resonator pair structures 802 and 804. As shown in FIG. 8, resonator pair structure 802 includes first resonator 806a and second resonator 806b which can be, for example, bulk acoustic wave (BAW) resonators. As shown in FIG. 8, first resonator 806a and second resonator 806b each include respective top electrodes 808a and 808b, which can comprise metal patterned and formed in an upper metal layer of a semiconductor structure, and respective bottom electrodes 810a and 810b, which can which can comprise metal patterned and formed in a lower metal layer of a semiconductor structure. Thus, as further shown in FIG. 8, top electrodes 808a and 808b are respectively situated over bottom electrodes 810a and 810b. A piezoelectric material (not shown in FIG. 8), such as Aluminum Nitride (AlN), can be situated between top electrode 808a and bottom electrode 810a of first resonator 806a and between top electrode 808b and bottom electrode 810b of second resonator 806b.

As shown in FIG. 8, first resonator 806a and second resonator 806b have respective widths 812a and 812b and respective lengths 814a and 814b. For example, widths 812a and 812b and lengths 814a and 814b can each be approximately 140 microns, such that the total area of first resonator 806a and second resonator 806b is approximately 20,000 square microns. As also shown in FIG. 8, first resonator 806a and second resonator 806b each include respective first terminals 816a and 816b and respective second terminals 818a and 818b. As further shown in FIG. 8, first terminals 816a and 816b are respectively connected to top electrodes 808a and 808b and second terminals 818a and 818b are respectively connected to bottom electrodes 810a and 810b. First resonator 806a and second resonator 806b each have a polarity, where first terminals 816a and 816b represent the respective positive terminals of first resonator 806a and second resonator 806b and where second terminals 818a and 818b represent the respective negative terminals of first resonator 806a and second resonator 806b.

As shown in FIG. 8, first resonator 806a and second resonator 806b are coupled together in an anti-parallel configuration. More specifically, first terminal 816a (i.e., the positive terminal) of first resonator 806a is connected by top metal portion 820 to second terminal 818b (i.e., the negative terminal) of second resonator 806b through a via (not shown in FIG. 8) and second terminal 818a (i.e., the negative terminal) of first resonator 806a is connected to top metal portion 822 through a via (not shown in FIG. 8), so as to be connected to first terminal 816b (i.e., the positive terminal) of second resonator 806b. Therefore, as shown in FIG. 8, resonator pair 802 includes two resonators (i.e., first resonator 806a and second resonator 806b) where each resonator has approximately the same physical size as resonator 600 in FIG. 6.

As shown in FIG. 8, resonator pair 804, which is equivalent to resonator pair 802, is connected to resonator pair 802 in a series configuration. More specifically, resonator pair 802 is connected to resonator pair 804 in series via top metal portion 824. Thus, as discussed above, since each resonator pair provides one-half the impedance of a single undivided resonator (e.g., resonator 600 in FIG. 6), the configuration shown in FIG. 8 advantageously provides the impedance of a single resonator by including two resonator pairs connected in series.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a bulk acoustic wave filter with reduced nonlinear signal distortion has been described.

The invention claimed is:

1. A filter circuit comprising:
an input and an output;
at least one series resonator pair, said at least one series resonator pair comprising a first resonator coupled to a second resonator in an anti-parallel configuration, said at least one series resonator pair being coupled between said input and said output; and
at least one individual series resonator coupled between said input and said output in a series configuration with the at least one series resonator pair;

wherein said anti-parallel configuration of said first and second resonators causes a reduction in harmonic signal generation or other nonlinear distortion in said filter circuit; and wherein said first and second resonators and said at least one individual series resonator are approximately equal in physical size.

2. The filter circuit of claim 1 wherein at least two resonators in said filter circuit have a same resonance frequency.

3. The filter circuit of claim 1 wherein at least one series resonator pair comprises a plurality of series resonator pairs coupled between said input and said output in a series configuration.

4. The filter circuit of claim 1 wherein said first and second resonators are bulk acoustic wave (BAW) resonators.

5. The filter circuit of claim 1, wherein a plurality of series resonator pairs and at least one shunt resonator pair are utilized in a configuration selected so as to cause a reduction in harmonic signal generation or other nonlinear distortion on said filter circuit.

6. The filter circuit of claim 1, further comprising:
at least one shunt resonator pair, said at least one shunt resonator pair comprising a third resonator coupled to a fourth resonator in an anti-parallel configuration, said at least one shunt resonator pair being coupled between ground and a selected node in said filter circuit;
wherein said anti-parallel configuration of said third and fourth resonators causes a reduction in harmonic signal generation or other nonlinear distortion in said filter circuit.

7. The filter circuit of claim 6 wherein said at least one shunt resonator pair comprises a plurality of shunt resonator pairs coupled between said ground and a respective plurality of selected nodes in said filter circuit.

8. The filter circuit of claim 6 wherein said third and fourth resonators are bulk acoustic wave (BAW) resonators.

9. The filter circuit of claim 6 wherein said third and fourth resonators are approximately equal in physical size.

10. The filter circuit of claim 6 wherein a plurality of shunt resonator pairs and at least one series resonator pair are utilized in a configuration selected so as to cause a reduction in harmonic signal generation or other nonlinear distortion in said filter circuit.

11. A filter circuit comprising:
an input and an output;
at least one series resonator pair coupled to said input in a series configuration;
at least one shunt resonator pair coupled to said input in a shunt configuration;
at least one series resonator coupled between said at least one series resonator pair and said output;
at least one shunt resonator coupled between said at least one series resonator pair and said at least one series resonator in a shunt configuration;
wherein a polarity of said at least one series resonator and a polarity of said at least one shunt resonator is oriented to reduce harmonic signal generation or other nonlinear distortion in said filter circuit;
wherein said at least one series resonator pair comprises a first resonator coupled to a second resonator in an anti-parallel configuration;
wherein said at least one shunt resonator pair comprises a third resonator coupled to a fourth resonator in an anti-parallel configuration; and
wherein said at least one series resonator pair comprises a plurality of series resonator pairs, where said plurality of series resonator pairs are coupled between said input and said at least one series resonator in a series configuration.

12. A filter circuit comprising:
an input and an output;
at least one series resonator pair coupled to said input in a series configuration;
at least one shunt resonator pair coupled to said input in a shunt configuration;
at least one series resonator coupled between said at least one series resonator pair and said output;
at least one shunt resonator coupled between said at least one series resonator pair and said at least one series resonator in a shunt configuration;
wherein a polarity of said at least one series resonator and a polarity of said at least one shunt resonator is oriented to reduce harmonic signal generation or other nonlinear distortion in said filter circuit;
wherein said at least one shunt resonator pair comprises a plurality of shunt resonator pairs coupled to said input in a series configuration.

13. The filter circuit of claim 12, wherein said plurality of shunt resonator pairs each comprises a first resonator and a second resonator coupled together in an anti-parallel configuration.

14. The filter circuit of claim 12, wherein said first and second resonators are bulk acoustic wave (BAW) resonators.

15. A filter circuit comprising:
an input and an output;
at least one series resonator pair coupled to said input in a series configuration;
at least one shunt resonator pair coupled to said input in a shunt configuration;
at least one series resonator coupled between said at least one series resonator pair and said output;
at least one shunt resonator coupled between said at least one series resonator pair and said at least one series resonator in a shunt configuration;
wherein a polarity of said at least one series resonator and a polarity of said at least one shunt resonator is oriented to reduce harmonic signal generation or other nonlinear distortion in said filter circuit;
wherein said at least one series resonator pair comprises a first resonator coupled to a second resonator in an anti-parallel configuration;
wherein said at least one shunt resonator pair comprises a third resonator coupled to a fourth resonator in an anti-parallel configuration; and
wherein said first and second resonators each have a resonance frequency and said third and fourth resonators each have said resonance frequency.

* * * * *